(12) United States Patent
Gao et al.

(10) Patent No.: US 12,061,223 B2
(45) Date of Patent: Aug. 13, 2024

(54) METHOD AND SYSTEM FOR TRAVELING WAVE-BASED FAULT LOCATION OF AC AND DC TRANSMISSION LINES BASED ON 5G COMMUNICATION

(71) Applicant: SHANDONG UNIVERSITY, Shandong (CN)

(72) Inventors: Houlei Gao, Jinan (CN); Tong Yuan, Jinan (CN); Yunchi Zhang, Jinan (CN); Bin Xu, Jinan (CN); Lin Li, Jinan (CN)

(73) Assignee: SHANDONG UNIVERSITY, Jinan (CN)

( * ) Notice: Subject to any disclaimer, the term of this patent is extended or adjusted under 35 U.S.C. 154(b) by 0 days.

(21) Appl. No.: 17/920,181

(22) PCT Filed: Jul. 6, 2021

(86) PCT No.: PCT/CN2021/104785
§ 371 (c)(1),
(2) Date: Oct. 20, 2022

(87) PCT Pub. No.: WO2022/262019
PCT Pub. Date: Dec. 22, 2022

(65) Prior Publication Data
US 2024/0210461 A1  Jun. 27, 2024

(30) Foreign Application Priority Data
Jun. 17, 2021 (CN) .......... 202110671988.4

(51) Int. Cl.
*G01R 31/08*  (2020.01)
(52) U.S. Cl.
CPC ......... *G01R 31/085* (2013.01); *G01R 31/088* (2013.01)
(58) Field of Classification Search
CPC ..... G01R 31/08; G01R 31/085; G01R 31/088
See application file for complete search history.

(56) References Cited

U.S. PATENT DOCUMENTS

2019/0187202 A1  6/2019  Schweitzer et al.
2020/0110124 A1*  4/2020  Schweitzer, III .... G01R 31/085

FOREIGN PATENT DOCUMENTS

| CN | 210090598 U | 2/2020 |
| CN | 111766470 A | 10/2020 |
| CN | 112946424 A | 6/2021 |

OTHER PUBLICATIONS

Feb. 25, 2022 International Search Report issued in Patent Application No. PCT/CN2021/104785.
Feb. 25, 2022 Written Opinion of the International Searching Authority issued in Patent Application No. PCT/CN2021/104785.
(Continued)

*Primary Examiner* — Jimmy T Vu
(74) *Attorney, Agent, or Firm* — Oliff PLC

(57) ABSTRACT

A method and system for traveling wave-based fault location of AC and DC transmission lines based on 5G communication. The method includes: calibrating time based on time information sent by a 5G base station; generating synchronous sampling pulses by using the calibrated time and a crystal oscillator, collecting a current signal, and on this basis, detecting a fault instant and an arrival instant of traveling wave head of a local end; sending the arrival instant of traveling wave head of the local end to an opposite end through a 5G network; and calculating a distance from a fault to either end according to the arrival instant of traveling wave head of the local end, an arrival instant of traveling wave head of the opposite end, and a full length of a line.

8 Claims, 3 Drawing Sheets

(56) References Cited

Qin, Jian et al., "A New Double Terminal Method of Travelling With Fault Location Using Wavelet Transform.", Proceedings of the CSEE, (2000), vol. 20, No. 8, pp. 6-10.

Yuan, Tong et al., "Research on 5G High-Precision Time Synchronization and its Application Mode in Power Grid.", Electric Power Information and Communication Technology, (2020), vol. 18, No. 8, pp. 47-53.

* cited by examiner

METHOD AND SYSTEM FOR TRAVELING WAVE-BASED FAULT LOCATION OF AC AND DC TRANSMISSION LINES BASED ON 5G COMMUNICATION

TECHNICAL FIELD

The present invention belongs to the field of power system relay protection, and in particular to a method and system for traveling wave-based fault location of AC and DC transmission lines based on 5G communication.

BACKGROUND

The description in this section merely provides background information related to the present invention and does not necessarily constitute the prior art.

The fault location of AC/DC transmission lines is responsible for quick clearing of line faults. The precise location of faults is of great significance for timely repairing lines and improving power supply reliability. At present, among the fault location methods commonly used, double-ended traveling wave-based fault location is more advantageous due to the fact that the principle is simple, the location accuracy is not affected by transition resistances and fault types. The principle is as shown in FIG. 1. It is assumed that $t_{0M}$ and $t_{0N}$ are instants at which a fault initial traveling wave arrives at M-side and N-side buses, respectively, then $$\frac{L_{MF}}{V} - \frac{L_{MN} - L_{MF}}{V} = t_{0M} - t_{0N}$$

in the formula: v is a traveling wave propagation speed, which is close to the velocity of light. According to the above formula, $L_{MF}$ and $L_{NF}$ can be obtained for both sides of a line.

It can be seen that for the application of the double-ended traveling wave-based fault location, it needs to solve the problems about high-precision time synchronization and time information transmission at both ends of the line. A time error of 1 us will bring about a fault location error of about 150 m. At present, a time synchronization method commonly used is GPS satellite independent timing, and an arrival instant of an initial traveling wave of a local end is transmitted to an opposite end by means of a 2M channel opened by a data transmission network to complete fault location calculation. The inventor found that the GPS satellite independent timing has the problems of easy signal interference, high construction cost and the like: and the data transmission network, as a medium for time information transmission at both ends, faces the problems of easy damage by external forces, difficult laying, high cost and the like.

SUMMARY

In order to solve the technical problems in the background, the present invention provides a method and system for traveling wave-based fault location of AC and DC transmission lines based on 5G communication, which utilizes the high-precision time information provided by a 5G network to provide a high-precision time reference for both ends of a line, and also utilizes the 5G network to transmit the time information required in traveling wave-based fault location.

To achieve the foregoing objective, the present invention uses the following technical solutions.

A first aspect of the present invention provides a method for traveling wave-based fault location of AC and DC transmission lines based on 5G communication.

A method for traveling wave-based fault location of AC and DC transmission lines based on 5G communication includes:
calibrating time based on time information sent by a 5G base station;
generating synchronous sampling pulses by using the calibrated time and a crystal oscillator, collecting a current signal, and on this basis, detecting a fault instant and an arrival instant of a traveling wave head of a local end;
sending the arrival instant of traveling wave head of the local end to an opposite end through a 5G network; and
calculating a distance from a fault to either end according to the arrival instant of traveling wave head of the local end, an arrival instant of traveling wave head of the opposite end, and a full length of a line.

As an embodiment, in the process of generating synchronous sampling pulses, a current sampling frequency is the same as and is synchronized with a frequency of the crystal oscillator.

As an embodiment, in the process of generating synchronous sampling pulses, the crystal oscillator is synchronized by a rising edge of a pulse per second.

As an embodiment, the fault instant is detected by using a sudden change of a current.

As an embodiment, once the sudden change of the current of a continuously set number of sampling points is greater than a set threshold value, sampling values of one cycle before and after an initial fault detection instant are locked, and then the arrival instant of traveling wave head is precisely located.

As an embodiment, multi-resolution morphological gradient transform is performed on the locked current sampling values to calculate the arrival instant of traveling wave head.

As an embodiment, wavelet transform is performed on the locked current sampling values to calculate the arrival instant of traveling wave head.

A second aspect of the present invention provides a system for traveling wave-based fault location of AC and DC transmission lines based on 5G communication.

A system for traveling wave-based fault location of AC and DC transmission lines based on 5G communication includes:
a time calibration module, configured to calibrate time based on time information sent by a 5G base station;
a head instant detection module, configured to generate synchronous sampling pulses by using the calibrated time and a crystal oscillator, collect a current signal, and on this basis, detect a fault instant and an arrival instant of traveling wave head of a local end;
a 5G communication module, configured to send the arrival instant of traveling wave head of the local end to an opposite end through a 5G network; and
a fault location module, configured to calculate a distance from a fault to either end according to the arrival instant of traveling wave head of the local end, an arrival instant of traveling wave head of the opposite end, and a full length of a line.

A third aspect of the present invention provides a computer-readable storage medium.

Provided is a computer-readable storage medium, with a computer program stored thereon, wherein when the program is executed by a processor, the steps in the method for traveling wave-based fault location of AC and DC transmission lines based on 5G communication described above are implemented.

A fourth aspect of the present invention provides a computer device.

A computer device includes a memory, a processor and a computer program stored on the memory and capable of running on the processor, wherein when the program is executed by the processor, the steps in the method for traveling wave-based fault location of AC and DC transmission lines based on 5G communication described above are implemented.

Compared with the prior art, the present invention has the following beneficial effects.

(1) According to the present invention, the high-precision time information and transmission delay estimation of the 5G network are used, such that the high-precision time synchronization problem of fault location is solved. Compared with the traditional method, this technical solution has obvious advantages in performance reliability, ease of deployment and control of maintenance cost.

(2) According to the present invention, the initiation of the sudden change of a current is used as the initial detection of the fault instant. Once initiated, the arrival instant of traveling wave head is measured, which effectively avoids the data burden of real-time wave head detection and reduces the complexity of traveling wave-based fault detection. Meanwhile, under the sampling frequency of 1 MHZ, with consideration of the 5G timing error and the detection error of traveling wave head, the fault detection accuracy within 300 meters can be achieved.

(3) According to the present invention, the characteristics of low transmission delay and wide transmission range of the 5G network are utilized, such that even for trans-provincial AC/DC transmission lines, the fault location for faults within 500 ms of occurrence can still be ensured. This technical solution can greatly shorten the fault location time, compared with a traditional solution, which uses the data transmission network to open the 2M channel to transmit the time information, and has the fault location time of several seconds.

(4) According to the present invention, the 5G network is used for simultaneously solving the high-precision time reference problem and the data transmission problem in the double-ended traveling wave-based fault location, and a practical technical solution is provided, realizing broad application prospects. The traveling wave-based fault location method of the present invention is suitable for both AC transmission lines and DC transmission lines.

The additional aspects and advantages of the present invention will be set forth in part in the description below; parts of which will become apparent from the description below, or will be understood by the practice of the present invention.

BRIEF DESCRIPTION OF THE DRAWINGS

The accompanying drawings constituting a part of the present invention are used to provide a further understanding of the present invention. The exemplary embodiments of the present invention and descriptions thereof are used to explain the present invention, and do not constitute an improper limitation of the present invention.

DETAILED DESCRIPTION

The present invention is further described below with reference to the accompanying drawings and embodiments.

It should be noted that the following detailed descriptions are all illustrative and are intended to provide further descriptions of the present invention. Unless otherwise specified, all technical and scientific terms used herein have the same meanings as those usually understood by a person of ordinary skill in the art to which the present invention belongs.

It should be noted that the terms used herein are merely used for describing specific implementations, and are not intended to limit exemplary implementations of the present invention. As used herein, the singular form is also intended to include the plural form unless the context clearly dictates otherwise. In addition, it should further be understood that, terms "comprise" and/or "include" used in this specification indicate that there are features, steps, operations, devices, components, and/or combinations thereof.

Example 1

Figure 1:
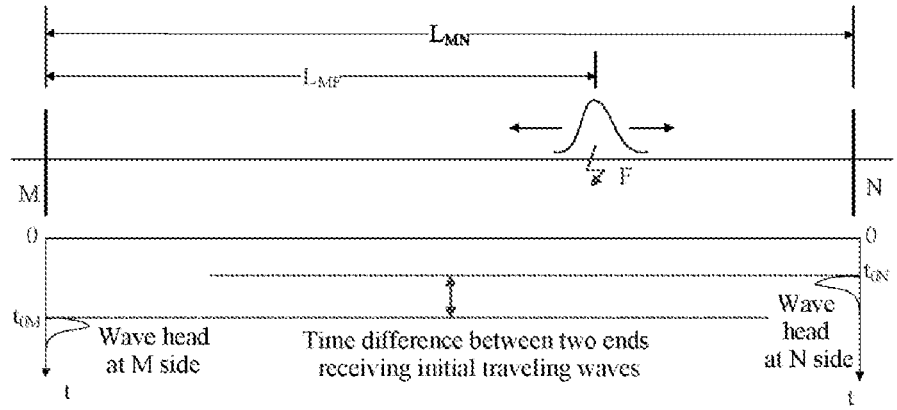
FIG. 1 is a schematic diagram of double-ended traveling wave-based fault location.
Figure 2:
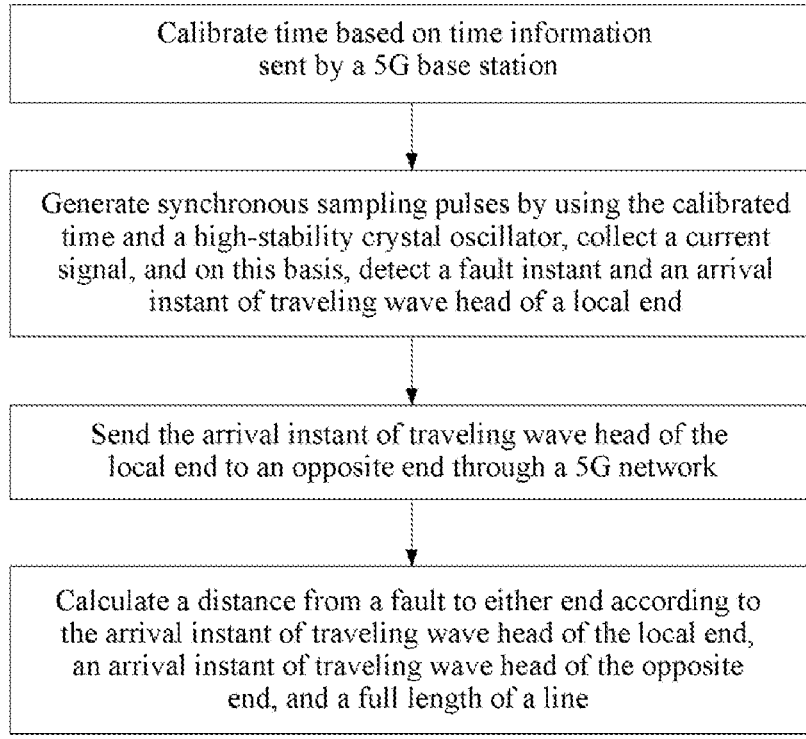
FIG. 2 is a flowchart of a method for traveling wave-based fault location of AC and DC transmission lines based on 5G communication according to an example of the present invention.

As shown in FIG. 2, a method for traveling wave-based fault location of AC and DC transmission lines based on 5G communication of this example specifically includes the following steps:

Step 1: Time is calibrated based on time information sent by a 5G base station.

Specifically, a 5G base station in an area is set to issue a time-related signaling SIB9. At the same time, a fault location device is connected to a 5G terminal, and accessed to a 5G network through an SIM card to obtain high-precision time information and transmission delay compensation from the 5G base station in real time, and output a pulse per second and absolute time information. The absolute time information includes year, month, day, hour, and minute, and the precision of the pulse per second is less than 1 μs.

The pulse per second is output to a counter, and is counted in real time, and the counter is reset to zero after every 60 counts.

Step 2: Synchronous sampling pulses are generated by using the calibrated time and a high-stability crystal oscillator, a current signal is collected, and on this basis, a fault instant and an arrival instant of traveling wave head of a local end are detected.

The sampling pulses are controlled by the crystal oscillator (e.g., a high-stability crystal oscillator), so that a current sampling frequency is the same as and is synchronized with a frequency of the high-stability crystal oscillator. With the consideration of drift errors of the crystal oscillator, the crystal oscillator may be further synchronized by a rising edge of the pulse per second to eliminate the accumulation of errors.

Figure 3:
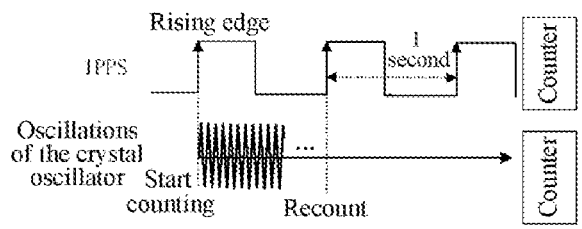
FIG. 3 is a schematic diagram of a pulse per second and high-stability crystal oscillator oscillation counting according to an example of the present invention.

At the same time, a counter counts oscillations of the crystal oscillator. The counter is triggered to reset to zero at the rising edge of the pulse per second, that is, to count the number of oscillations of the crystal oscillator per second, as shown in FIG. 3.

In order to reduce the burden of data processing, the initial location of the fault instant is firstly realized by a conventional fault instant detection method, at millisecond level accuracy. A sudden change of a current is used for detection, with the following calculation formula:

$$i_g(k) = ||i(k) - i(k-N)| - |i(k-N) - i(k-2N)||$$

in the formula, k is a sampling number, N is a number of samples per cycle, and $i_g$ is a sudden change of a current.

Once the sudden change of the current of a continuously set number of (e.g., three) sampling points is greater than a set threshold value, a fault location device is initiated, and sampling values of one cycle before and after an initial fault detection instant are locked. On this basis, the arrival instant of traveling wave head is precisely positioned.

Figure 4:
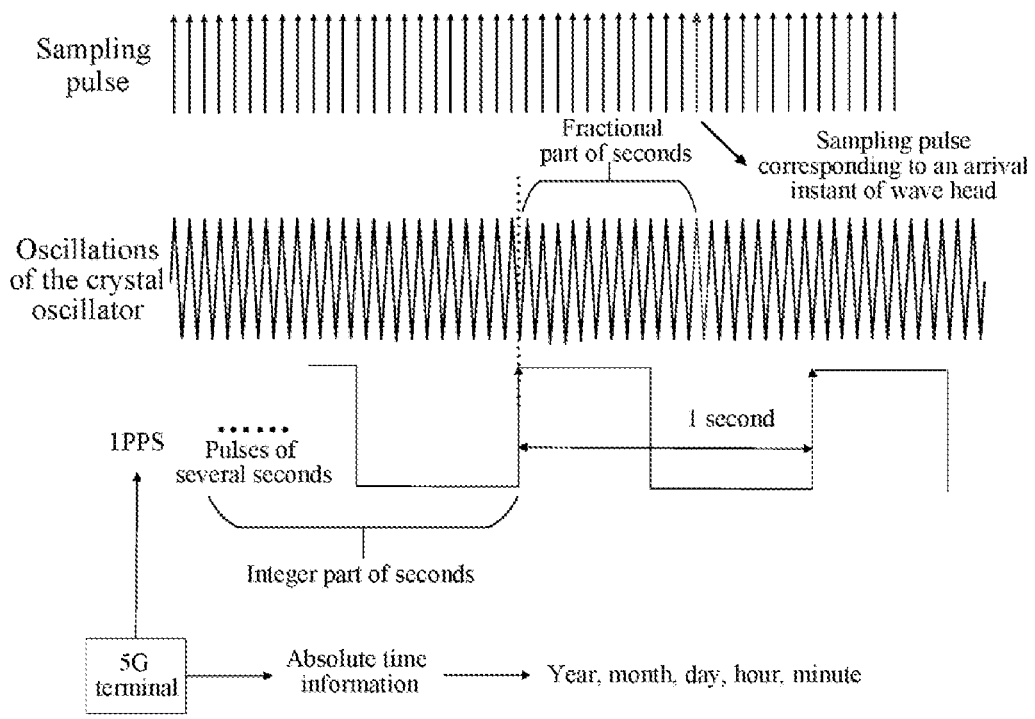
FIG. 4 is a schematic diagram of measurement of an arrival instant of traveling wave head according to an example of the present invention.
Figure 5:
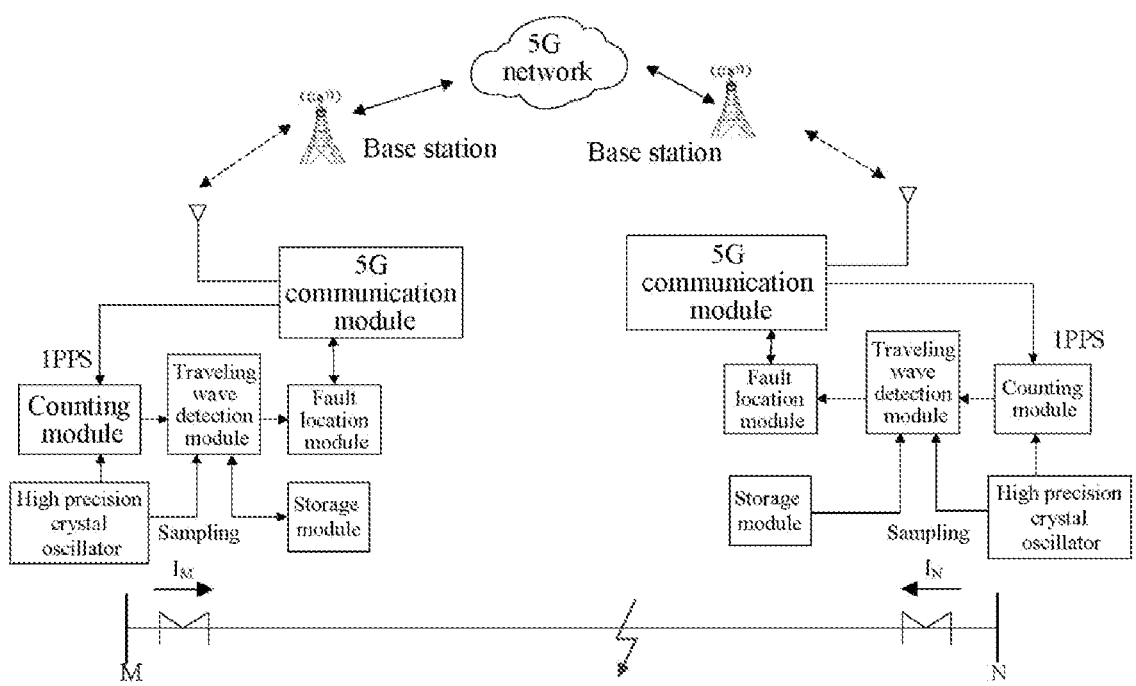
FIG. 5 is a schematic structural diagram of a system for traveling wave-based fault location of AC and DC transmission lines based on 5G communication according to an example of the present invention.

In an example, multi-resolution morphological gradient transform is performed on the locked current sampling values. Generally, two stages of morphological gradient operations are performed. If it is detected that an output gradient amplitude exceeds a set value Mset, it is regarded as a first extreme point of the gradient value, and the sampling point is marked. An instant corresponding to the sampling point may be considered as the arrival instant of traveling wave head. Moreover, the output is in the form of xx year xx month xx day xx hour xx minute xx.yy second. The integer parts of the year, month, day, hour, minute and second are obtained by the counter of the pulse per second and absolute time information. The fractional part of the second is obtained by the counter of oscillations of the crystal oscillator, as shown in the following formula:

$$t_1 = \frac{S}{f}$$

in the formula, S is a number of oscillations of the crystal oscillator corresponding to the marked sampling point, f is a frequency of the crystal oscillator, in Hertz, and $t_1$ is a fractional part of the instant corresponding to the sampling point, in seconds. It can be concluded that using the method to measure the arrival instant of traveling wave head, the error does not exceed 1 crystal oscillator period. When the frequency of the high-stability crystal oscillator is 1 MHz, the error of the arrival instant of traveling wave head is within 1 μs. The measurement principle of the arrival instant of traveling wave head is shown in FIG. 4.

The selection criterion for the first extreme point is:

$$M > M_{set}$$

where M is a gradient amplitude value of real-time detection, and $M_{set}$ is a set threshold value, which may be obtained from experience.

In another example, wavelet transform is performed on the locked current sampling values to calculate the arrival instant of traveling wave head.

It should be noted that those skilled in the art can calculate the arrival instant of traveling wave head according to the actual situation.

Step 3: The arrival instant of traveling wave head of the local end is sent to an opposite end through a 5G network.

In specific embodiment, when the arrival instant of wave head of the local end is sent between fault location devices of the AC and DC transmission lines, the information is sent to the 5G terminal of the opposite end first, and then forwarded by the 5G terminal to the fault location devices.

Step 4: A distance from a fault to either end is calculated according to the arrival instant of traveling wave head of the local end, an arrival instant of traveling wave head of the opposite end, and a full length of a line.

The fault location calculation is performed according to the arrival time of traveling wave head of the local end and the received arrival time of traveling wave head of the opposite end, with the following formula:

$$\begin{cases} L_{MF} = 0.5[v(t_{0M} - t_{0N}) + L] \\ L_{NF} = 0.5[v(t_{0N} - t_{0M}) + L] \end{cases}$$

where v is a traveling wave velocity, $L_{MF}$ and $L_{NF}$ are distances from a fault point to two ends M and N of a line respectively, $t_{0M}$ and $t_{0N}$ are arrival instants of wave heads at both ends M and N respectively, and L is a full length of the line.

Example 2

This example provides a system for traveling wave-based fault location of AC and DC transmission lines based on 5G communication, which specifically include the following modules:

- a time calibration module, configured to calibrate time based on time information sent by a 5G base station;
- a head instant detection module, configured to generate synchronous sampling pulses by using the calibrated time and a crystal oscillator, collect a current signal, and on this basis, detect a fault instant and an arrival instant of traveling wave head of a local end;
- a 5G communication module, configured to send the arrival instant of traveling wave head of the local end to an opposite end through a 5G network; and
- a fault location module, configured to calculate a distance from a fault to either end according to the arrival instant of traveling wave head of the local end, an arrival instant of traveling wave head of the opposite end, and a full length of a line.

It should be noted that, each module in this embodiment and each step in Example 1 are in a one-to-one correspondence, and specific implementation processes thereof are the same. This is not described herein again.

Example 3

This example provides a computer-readable storage medium, with a computer program stored thereon, wherein when the program is executed by a processor, the steps in the method for traveling wave-based fault location of AC and DC transmission lines based on 5G communication according to Example 1 are implemented.

Example 4

This example provides a computer device, including a memory, a processor and a computer program stored on the memory and capable of running on the processor, wherein when the program is executed by the processor, the steps in the method for traveling wave-based fault location of AC and DC transmission lines based on 5G communication according to Example 1 are implemented.

A person skilled in the art should understand that the embodiments of the present invention may be provided as a method, a system, or a computer program product. Therefore, the present invention may use a form of hardware embodiments, software embodiments, or embodiments with a combination of software and hardware. Moreover, the present invention may use a form of a computer program product that is implemented on one or more computer-usable storage media (including but not limited to a magnetic disk storage, an optical storage, and the like) that include computer-usable program code.

The present invention is described with reference to flowcharts and/or block diagrams of the method, device (system), and computer program product in the embodiments of the present invention. It should be understood that computer program instructions may be used to implement each process and/or each block in the flowcharts and/or the block diagrams and a combination of a process and/or a block in the flowcharts and/or the block diagrams. These computer program instructions may be provided to a general-purpose computer, a dedicated computer, an embedded processor, or a processor of another programmable data processing apparatus to generate a machine, so that the instructions executed by the computer or the processor of the another programmable data processing apparatus generate an apparatus for implementing a specific function in one or more processes in the flowcharts and/or in one or more blocks in the block diagrams.

These computer program instructions may alternatively be stored in a computer-readable memory that can instruct a computer or another programmable data processing device to work in a specific manner, so that the instructions stored in the computer-readable memory generate an artifact that includes an instruction apparatus. The instruction apparatus implements a specific function in one or more procedures in the flowcharts and/or in one or more blocks in the block diagrams.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

A person of ordinary skill in the art may understand that all or some of the procedures of the methods of the foregoing embodiments may be implemented by a computer program instructing relevant hardware. The program may be stored in a computer-readable storage medium. When the program is executed, the procedures of the foregoing method embodiments may be implemented. The foregoing storage medium may include a magnetic disc, an optical disc, a read-only memory (ROM), a random access memory (RAM), or the like.

The above descriptions are merely preferred embodiments of the present invention and are not intended to limit the present invention. A person skilled in the art may make various alterations and variations to the present invention. Any modification, equivalent replacement, or improvement made within the spirit and principle of the present invention shall fall within the protection scope of the present invention.

What is claimed is:

1. A method for traveling wave-based fault location of AC and DC transmission lines based on 5G communication, comprising:
    calibrating time based on time information sent by a 5G base station;
    generating synchronous sampling pulses by using the calibrated time and a high-stability crystal oscillator, collecting a current signal, and on this basis, detecting a fault instant and an arrival instant of traveling wave head of a local end;
    sending the arrival instant of traveling wave head of the local end to an opposite end through a 5G network; and
    calculating a distance from a fault to either end according to the arrival instant of traveling wave head of the local end, an arrival instant of traveling wave head of the opposite end, and a full length of a line;
    once a sudden change of a current of a continuously set number of sampling points is greater than a set threshold value, sampling values of one cycle before and after an initial fault detection instant are locked, and then the arrival instant of traveling wave head is precisely located;
    multi-resolution morphological gradient transform is performed on the locked current sampling values to calculate the arrival instant of traveling wave head.

2. The method for traveling wave-based fault location of AC and DC transmission lines based on 5G communication according to claim 1, wherein in the process of generating synchronous sampling pulses, a current sampling frequency is the same as and is synchronized with a frequency of the crystal oscillator.

3. The method for traveling wave-based fault location of AC and DC transmission lines based on 5G communication according to claim 2, wherein in the process of generating synchronous sampling pulses, the crystal oscillator is synchronized by a rising edge of a pulse per second.

4. The method for traveling wave-based fault location of AC and DC transmission lines based on 5G communication according to claim 1, wherein the fault instant is detected by using the sudden change of a current.

5. The method for traveling wave-based fault location of AC and DC transmission lines based on 5G communication according to claim 1, wherein wavelet transform is performed on the locked current sampling values to calculate the arrival instant of traveling wave head.

6. A computer-readable storage medium, with a computer program stored thereon, wherein when the program is executed by a processor, the steps in the method for traveling wave-based fault location of AC and DC transmission lines based on 5G communication according to claim 1 is implemented.

7. A computer device, comprising a memory, a processor and a computer program stored on the memory and capable of running on the processor, wherein when the program is executed by the processor, the steps in the method for traveling wave-based fault location of AC and DC transmission lines based on 5G communication according to claim 1 is implemented.

8. A system for traveling wave-based fault location of AC and DC transmission lines based on 5G communication, comprising:
- a time calibration module, configured to calibrate time based on time information sent by a 5G base station;
- a head instant detection module, configured to generate synchronous sampling pulses by using the calibrated time and a crystal oscillator, collect a current signal, and on this basis, detect a fault instant and an arrival instant of traveling wave head of a local end;
- a 5G communication module, configured to send the arrival instant of traveling wave head of the local end to an opposite end through a 5G network; and
- a fault location module, configured to calculate a distance from a fault to either end according to the arrival instant of traveling wave head of the local end, an arrival instant of traveling wave head of the opposite end, and a full length of a line;
- once a sudden change of a current of a continuously set number of sampling points is greater than a set threshold value, sampling values of one cycle before and after an initial fault detection instant are locked, and then the arrival instant of traveling wave head is precisely located;
- multi-resolution morphological gradient transform is performed on the locked current sampling values to calculate the arrival instant of traveling wave head.

* * * * *